United States Patent
Fukasaku et al.

(10) Patent No.: US 6,362,059 B2
(45) Date of Patent: Mar. 26, 2002

(54) PRODUCTION OF A SEMICONDUCTOR DEVICE HAVING A P-WELL

(75) Inventors: Katsuhiko Fukasaku; Atsuki Ono, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/876,072

(22) Filed: Jun. 8, 2001

(30) Foreign Application Priority Data

Jun. 9, 2000 (JP) .................................. 2000-174075

(51) Int. Cl.$^7$ .............................................. H01L 21/336
(52) U.S. Cl. ...................... 438/289; 438/306; 438/199; 438/981
(58) Field of Search ................................. 438/287–306, 438/199–203, 981

(56) References Cited

U.S. PATENT DOCUMENTS 5,960,319 A * 9/1999 Iwata et al. ................ 438/664
6,232,244 B1 * 5/2001 Ibok .......................... 438/770

* cited by examiner

Primary Examiner—Jey Tsai
(74) Attorney, Agent, or Firm—Young & Thompson

(57) ABSTRACT

A process for preparing a semiconductor which is capable of implanting indium effectively during the process of forming a gate insulation film with different levels of thickness includes a $1^{st}$ step of forming a $1^{st}$ resist mask on a predetermined region lying on a P-type silicon substrate having an element isolation region formed thereon to form a P-well region before forming a $1^{st}$ N-channel region made of components other than indium on the P-well region, a $2^{nd}$ step of removing the $1^{st}$ resist mask before forming a $1^{st}$ gate insulation film on the surface of the substrate, a $3^{rd}$ step of forming a $2^{nd}$ resist mask on the predetermined region except the $1^{st}$ N-channel region after forming the $1^{st}$ gate insulation film, and removing partially the $1^{st}$ gate insulation film, a $4^{th}$ step of forming a P-well region inside the $1^{st}$ gate insulation film partially removed region before forming a $2^{nd}$ N-channel region containing indium on this P-well region, and a $5^{th}$ step of removing the $2^{nd}$ resist mask before forming a $2^{nd}$ gate insulation film on the surface of the $2^{nd}$ N-channel region.

7 Claims, 5 Drawing Sheets

PRODUCTION OF A SEMICONDUCTOR DEVICE HAVING A P-WELL

FIELD OF THE INVENTION

This invention relates to a process for preparing a semiconductor device having a gate insulation film with plural different levels of thickness formed thereon and a N-channel region formed in the predetermined MOSFET region thereof using indium, in particular to the process for preparing a semiconductor device that is capable of implanting indium effectively.

BACKGROUND OF THE INVENTION

With the miniaturization of a MOSFET (Metal Oxide Semiconductor Field Effect Transistor), the necessity of forming super-micro devices of such sizes that are 0.1 $\mu$m or less arises. Accompanied by this event, how to restrain the deterioration of short channel properties such as forward and reverse short channel effects conspicuously appearing in proportion to the miniaturization is in problem. The reverse short channel effect appears resulting from the re-distribution of channel impurity concentration induced by diffusion. On account of this, as for a channel impurity in a NMOSFET, boron that has large re-distributed amount of impurities is being replaced by another element such as indium that has large atomic weight, small amount of diffusion and small re-distributed amount of impurities.

On the other hand, along with the miniaturization of the MOSFET, a SOC (System On a Chip) process for mounting various MOSFET's each having a gate insulation film of different thickness from each other such as MOSFET for use in a portion of a core region, MOSFET for low electric power use, MOSFET for use in a peripheral input/output circuit, high-density MOSFET for use in a high speed SRAM (Static Random Access Memory) on one semiconductor chip. In order to form a gate insulation film with different levels of thickness, techniques such as thermal oxidation using an oxidation furnace for forming a gate insulation film of a MOSFET for use in a portion of an I/O (Input/Output) region, RTP (Rapid Thermal Process) for forming a gate insulation film of a MOSFET for use in a portion of a core region are adopted. Here, RTP includes, for example, a process including the steps of annealing at predetermined temperature (e.g., 800° C.) for predetermined period of time (e.g., 1 minute) using $NH_3$ gas.

SUMMARY OF THE DISCLOSURE

However, there is much desired in the art. Namely indium has such a property that it is easy to be absorbed out of a channel region into the gate insulation film in case of forming a gate insulation film applying thermal oxidation. As a result, such a problem will occur that effects imparted by indium are lowered though indium ion implantation has been done with considerable effort.

An object of the present invention is to provide a process for preparing a semiconductor device which is capable of forming micro-devices of, e.g., 0.1 $\mu$m or less using indium and at the same time implanting indium effectively during the process of forming a gate insulation film with different levels of thickness.

In a first aspect of the present invention, a process is directed for preparing a semiconductor device having a gate insulation film with plural different levels of thickness formed on the semiconductor device and a N-channel region formed in the predetermined MOSFET region of the semiconductor device using indium, and includes (1) 1st step of forming a 1st resist mask on a predetermined region lying on a P-type silicon substrate having an element isolation region formed on the substrate to form a P-well region and thereafter forming a 1st N-channel region made of components other than indium on the P-well region, (2) 2nd step of removing the 1st resist mask and thereafter forming a 1st gate insulation film on the surface of the substrate, (3) 3rd step of forming a 2nd resist mask on the predetermined region except the 1st N-channel region after forming the 1st gate insulation film, and removing partially the 1st gate insulation film, (4) 4th step of forming a P-well region inside the 1st gate insulation film partially removed region and thereafter forming a 2nd N-channel region containing indium on this P-well region, and (5) 5th step of removing the 2nd resist mask and thereafter forming a 2nd gate insulation film on the surface of the 2nd N-channel region.

In the above process, it is preferable that the thickness of the 2nd gate insulation film is thinner than that of the 1st gate insulation film.

It is also preferable in the above process that the 2nd gate insulation film is formed by RTP.

In a second aspect of the present invention, a process is directed for preparing a semiconductor device having a gate insulation films with plural different levels of thickness formed on the semiconductor device and a N-channel region formed in the predetermined MOSFET region of the semiconductor device using indium, and includes (1) 1st step of forming a 1st resist mask on a predetermined region lying on a P-type silicon substrate having an element isolation region formed on the substrate to form a P-well region before forming a 1st N-channel region made of components other than indium on the P-well region, (2) 2nd step of removing the 1st resist mask before forming a 1st gate insulation film on the surface of the substrate, (3) 3rd step of forming a 2nd resist mask on the predetermined region except the 1st N-channel region after forming the gate insulation film, thereafter, forming a P-well region in the predetermined region except the 1st N-channel region through the gate insulation film before forming a 2nd N-channel region containing indium on this P-well region; and (4) 4th step of removing thinly the surface of the gate insulation film formed on the 2nd N-channel region.

It is preferable with regard to the aforementioned processes that the thickness of the gate insulation film on the 2nd N-channel region is 20 Å or less.

PREFERRED EMBODIMENTS OF THE INVENTION

When a process for preparing a semiconductor device having a gate insulation film with plural different levels of thickness formed on the semiconductor device and a N-channel region formed in the predetermined MOSFET region of the semiconductor device using indium includes (1) 1st step of forming a 1st resist mask on a predetermined region lying on a P-type silicon substrate having an element isolation region formed on the substrate to form a P-well region before forming a 1st N-channel region made of components other than indium on the P-well region, (2) 2nd step of removing the 1st resist mask before forming a 1st gate insulation film on the surface of the substrate, (3) 3rd step of forming a 2nd resist mask on the predetermined region except the 1st N-channel region after forming the 1st gate insulation film, and removing partially the 1st gate insulation film, (4) 4th step of forming a P-well region inside the region in which the 1st gate insulation film is removed before forming a 2nd N-channel region containing indium on this P-well region, and (5) 5th step of removing the 2nd resist mask before forming a 2nd gate insulation film on the surface of the 2nd N-channel region, indium absorbed into the gate insulation films can be minimized to prevent the deterioration of indium effects.

Taking a device using a N-channel MOSFET (Metal Oxide Semiconductor Field Effect Transistor) prepared according to 0.1 μm design rule and driven at source voltage Vdd=1.2V as a NMOSFET for use in a portion of a core region and having NMOSFET for use in a portion of a peripheral I/O (Input/Output) region and NMOSFET having a gate insulation film with different levels of thickness formed thereon as an example, an example of the present invention will be explained below in reference to the accompanying Drawings. FIGS. 1 and 2 are a fragmentary sectional view showing schematically the steps of a process for preparing a semiconductor device according to Example 1 of the present invention.

Figure 1A:
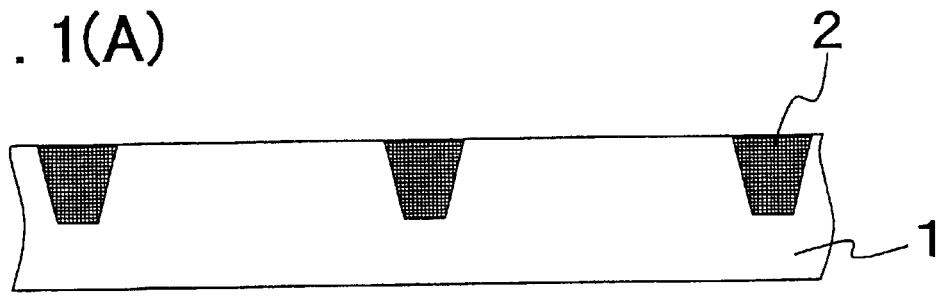
FIGS. 1(A) to (D): fragmentary sectional view showing schematically the steps of a process for preparing a semiconductor device according to Example 1 of the present invention
Figure 1B:
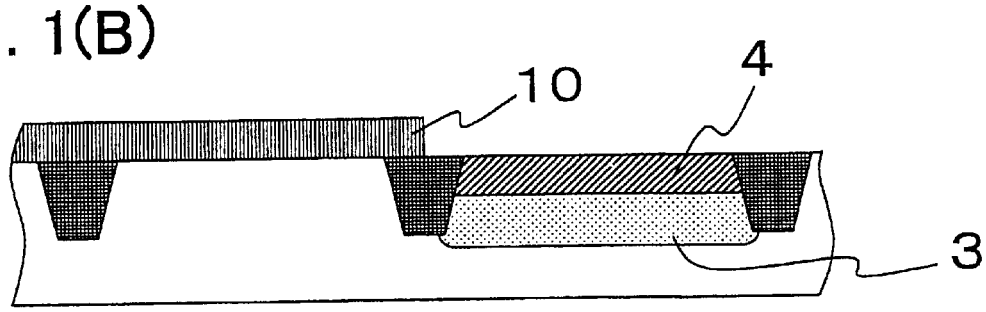
Figure 2A:
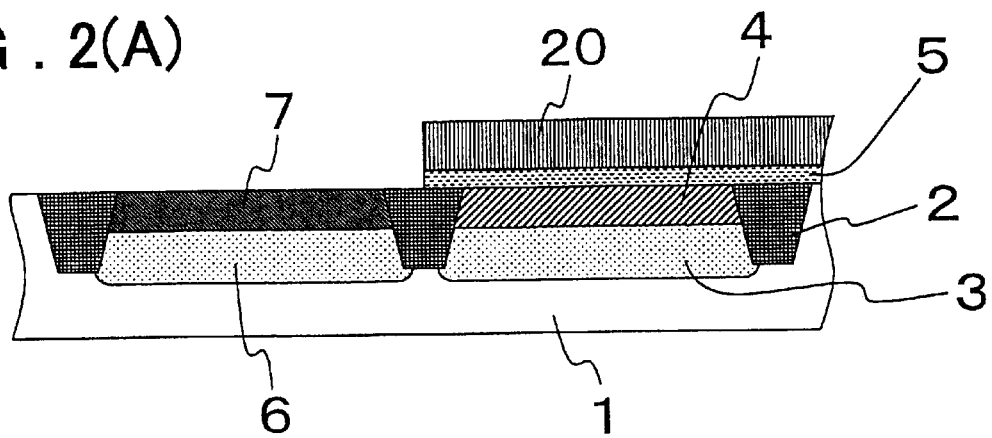
FIGS. 2(A) to (C): fragmentary sectional view showing schematically the steps of a process for preparing a semiconductor device according to Example 1 of the present invention
Figure 2B:
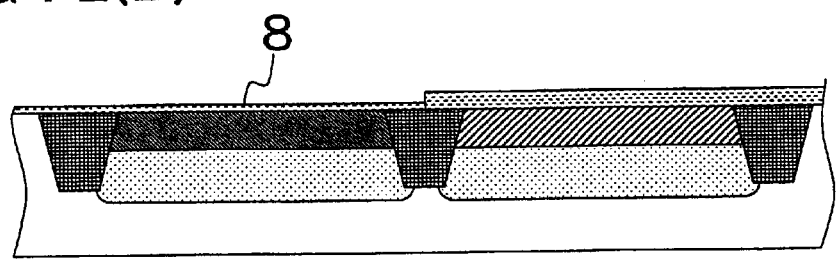
Figure 2C:
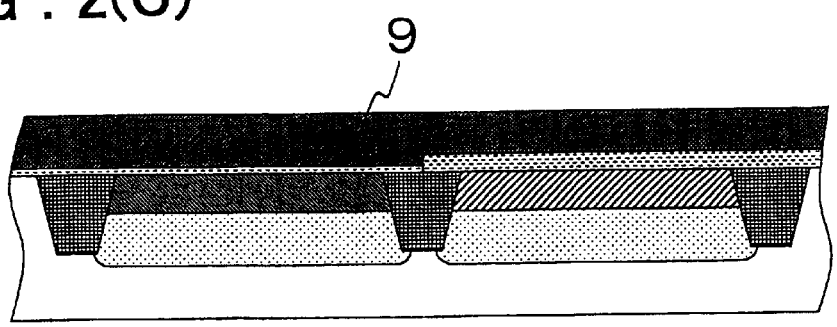

At first, according to the conventional process, an element isolation region 2 is formed on a P-type silicon substrate (cf. FIG. 1(A)).

Next, a resist pattern is formed applying photoresist (formation of a resist mask 10), and then $2 \times 10^{13}/cm^2$ of P-type impurities such as boron undergo ion implantation in a region for forming a NMOSFET for use in a portion of an I/O region (hereinafter shortened as "for I/O use") at 150 keV to form a P-well region 3. Thereafter $1 \times 10^{13}/cm^2$ of P-type impurities such as boron undergo ion implantation at 30 keV before forming a N-channel region 4 (cf. FIG. 1(B)).

Figure 1C:
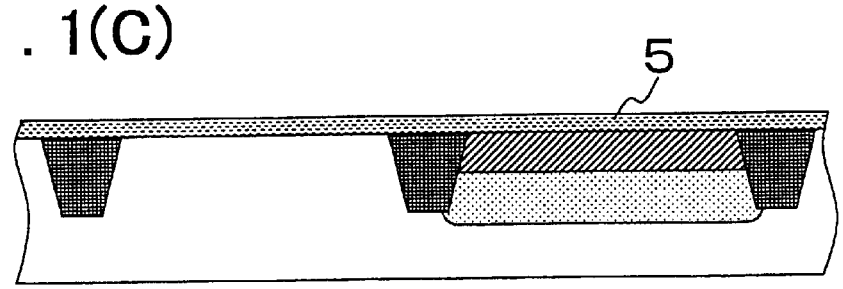

Next, the resist mask 10 is exfoliated, and then the surface is washed before forming a thick gate insulation film of 26 Å in thickness designed to be used for I/O over the surface by thermal oxidation (cf. FIG. 1(c)).

Figure 1D:
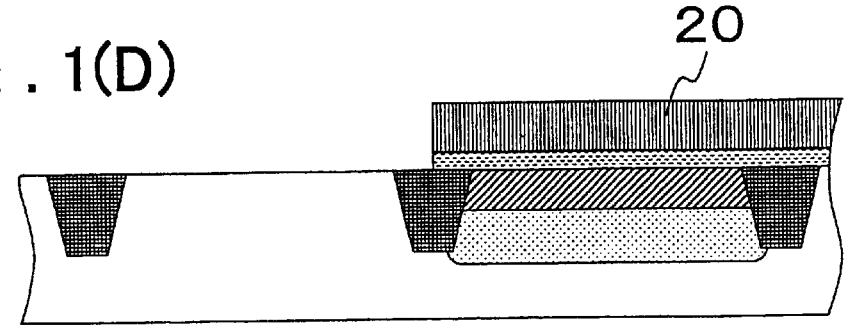

Next, a resist pattern is formed applying photoresist (formation of a resist mask 20), and then the gate insulation film existing on the region for forming a NMOSFET for use in a portion of a core region (hereinafter shortened as "for core use") is removed by wet etching (cf. FIG. 1(D)).

After that, $2 \times 10^{13}/cm^2$ of P-type impurities such as boron undergo ion implantation at 150 keV to form a P-well region 6, and further $1 \times 10^{13}/cm^2$ of P-type impurity of indium undergoes ion implantation at 30 keV to form a N-channel region 7 (cf. FIG. 2(E)).

Next, the resist mask 20 is exfoliated, and then the surface is washed before forming a gate insulation film of 16 Å in thickness over the surface by RTP (Rapid Thermal Process). Accordingly, a MOSFET having a gate insulation film with different levels of thickness is formed in such a way that a gate insulation film 5 is made thick in the region of a NMOSFET for I/O use, and at the same time that gate insulation film 10 is made thin in the region of a NMOSFET for core use (cf. FIG. 2(F)).

Next, a gate electrode 9 of about 1,500 Å in thickness made of polysilicon or the like is formed by CVD (Chemical Vapor Deposition) (cf. FIG. 2(G)).

Subsequent steps and also steps for forming a P-channel are the same with conventional ones.

In forming a N-channel region in a MOSFET having a gate insulation film with different levels of thickness formed thereon using indium correspondingly to respective MOSFET's such as MOSFET for core use and MOSFET for I/O use, indium is never absorbed into the gate insulation film for I/O use, thereby the deterioration of effects taken by the use of indium can be prevented by ion-implanting indium into the region of a NMOSFET for core use after forming a gate insulation film for I/O use by thermal oxidation.

In short, by virtue of ion implantation of indium after forming a gate insulation film 5 shown in FIG. 1(C), indium is never absorbed into the gate insulation film 5 through the thermal oxidation process. As a result, the deterioration of the effects taken by the use of indium can be prevented.

Next, another example of the present invention will be explained below with reference to the attached drawings. Here, the example of the present invention will be illustrated taking a NMOSFET having NMOSFET for core use and NMOSFET for I/O use each having a gate insulation film of different thickness from each other mounted thereon. FIGS. 3 and 4 are a partially sectional view showing schematically the steps of a process for preparing a semiconductor device according to Example 2 of the present invention.

Figure 3A:
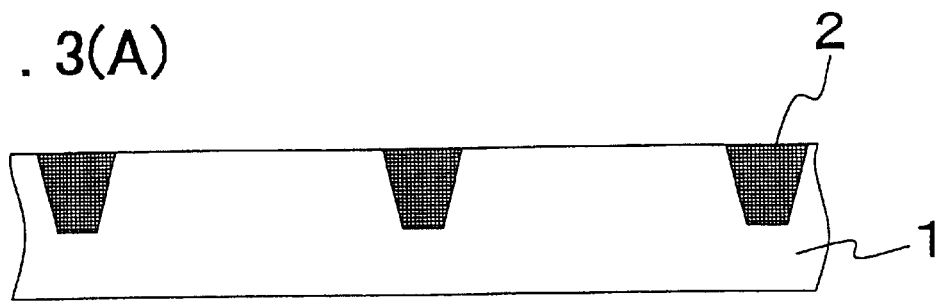
FIGS. 3(A) to (D): fragmentary sectional view showing schematically the steps of a process for preparing a semiconductor device according to Example 2 of the present invention
Figure 3B:
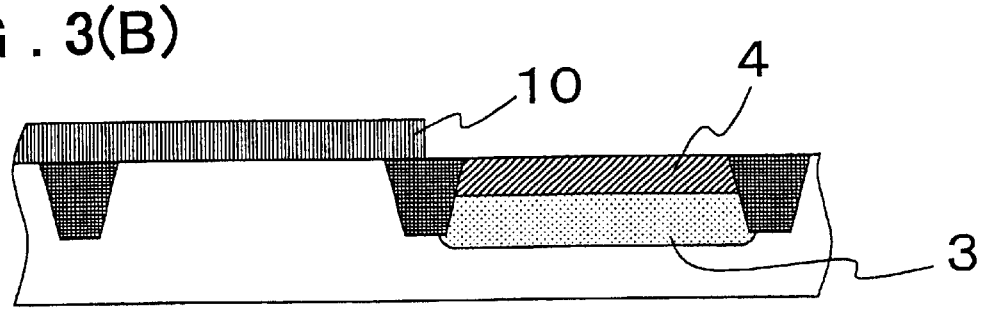
Figure 4A:
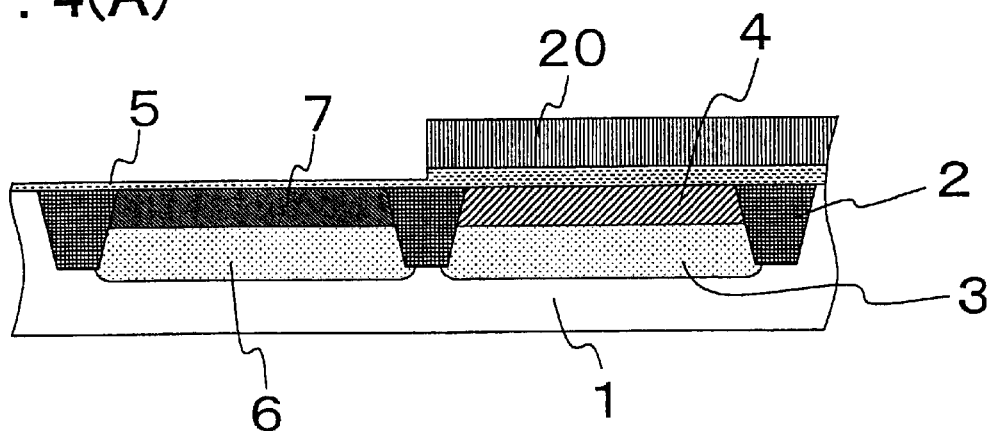
FIGS. 4(A) to (C): fragmentary sectional view showing schematically the steps of a process for preparing a semiconductor device according to Example 2 of the present invention
Figure 4B:
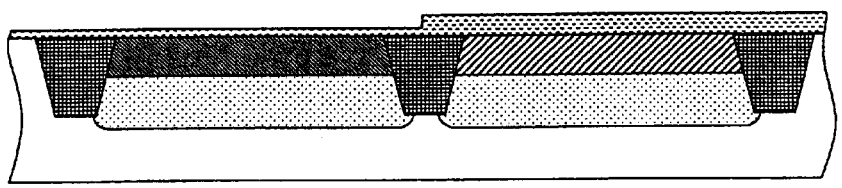
Figure 4C:
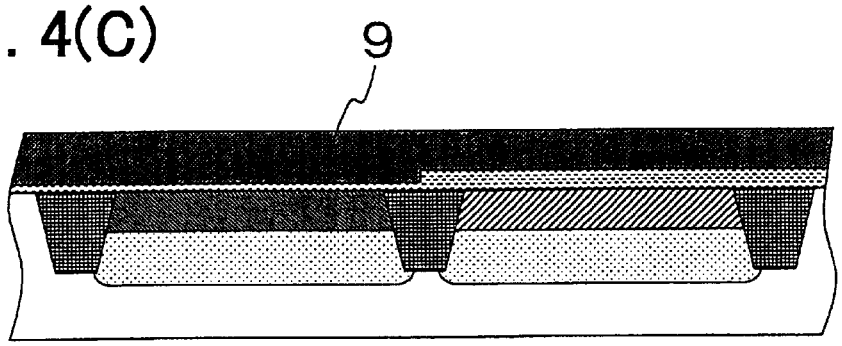

At first, according to the conventional process, an element isolation region 2 is formed on a P-type silicon substrate (cf. FIG. 3(A)).

Next, a resist pattern is formed applying photoresist (formation of a resist mask 10), then $2 \times 10^{13}/cm^2$ of P-type impurities such as boron undergo ion implantation in a region for forming a NMOSFET for I/O use at 150 keV to form a P-well region 3. Thereafter $1 \times 10^{13}/cm^2$ of P-type impurities such as boron undergo ion implantation at 30 keV before forming a N-channel region 4 (cf. FIG. 3(B)).

Figure 3C:
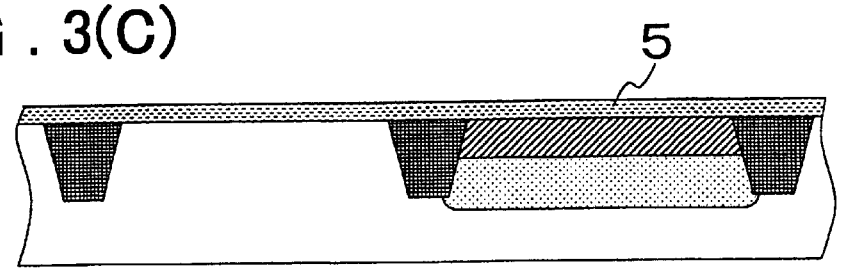

Next, the resist mask 10 is exfoliated, and then the surface is washed before forming a thick gate insulation film of 26 Å in thickness designed to be used for I/O over the surface by thermal oxidation (cf. FIG. 3(c)). The same procedures of Example 1 are repeated until here.

Figure 3D:
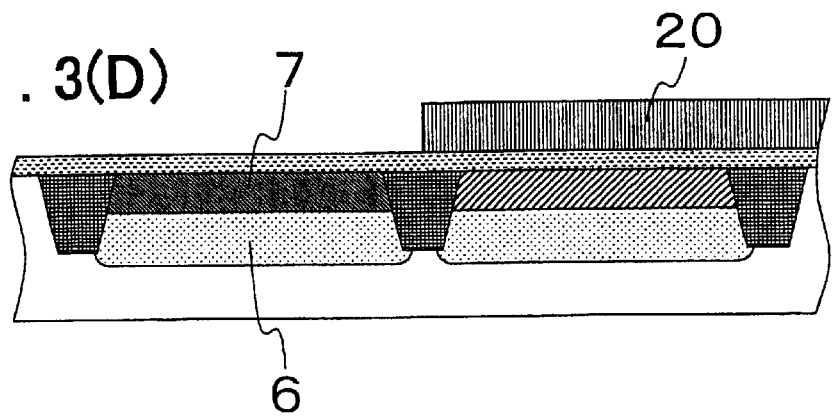

Next, a resist pattern is formed (formation of a resist mask 20), then $2 \times 10^{13}/cm^2$ of P-type impurities such as boron undergo ion implantation through the gate insulation film 5 formed on the occasion of forming the NMOSFET for core use to form a P-well region 6 before ion-implanting $1 \times 10^{13}/cm^2$ of P-type impurity of indium at 30 keV to form a N-channel region 7 (cf. FIG. 3(D)). In case that the gate insulation film 5 functions as a through insulation film in this way, such an advantage that the surface of a device can be protected from metallic pollution caused in an ion implantation apparatus.

Next, the gate insulation film 5 on the region for forming a NMOSFET for core use undergoes wet etching with the resist mask left, and a part of the gate insulation film 5 is thinly removed thereby (cf. FIG. 4(E)).

Next, the resist mask is removed and the whole surface is washed (cf. FIG. 4(F)) before forming a gate electrode 9 of about 1,500 Å in thickness made of polysilicon or the like by CVD (Chemical Vapor Deposition) (cf. FIG. 4(G)). Subsequent steps and also steps for forming a P-channel are the same with conventional ones.

In this Example 2, on the occasion of forming a N-channel region in a MOSFET having a gate insulation film with different levels of thickness formed thereon using indium correspondingly to respective MOSFET's such as MOSFET for core use and MOSFET for I/O use, indium undergoes ion implantation into the region of a NMOSFET for core use through the gate insulation film after forming a gate insulation film I/O use by thermal oxidation. Thereby, indium is never absorbed into the gate insulation film for I/O use. Accordingly, the deterioration of effects taken by the use of indium can be prevented, and at the same time the surface of a device can be protected from metallic pollution caused in an ion implantation apparatus.

In short, by virtue of ion-implanting indium through the gate insulation film after forming a gate insulation film 5 shown in FIG. 1(C), indium is never absorbed into the gate insulation film 5 through the thermal oxidation process. As a result, the deterioration of the indium effects can be prevented.

Next, the examples of the present invention will be compared with the conventional process in reference to the accompanying drawings. Here, a process for preparing a semiconductor device having a gate insulation film with different levels of thickness in such manners that NMOSFET for I/O use in and NMOSFET for core use have is taken as an example of the conventional process. FIG. 5 is a fragmentary sectional view showing schematically the steps of a process for preparing a semiconductor device according to the example of the conventional process.

Figure 5A:
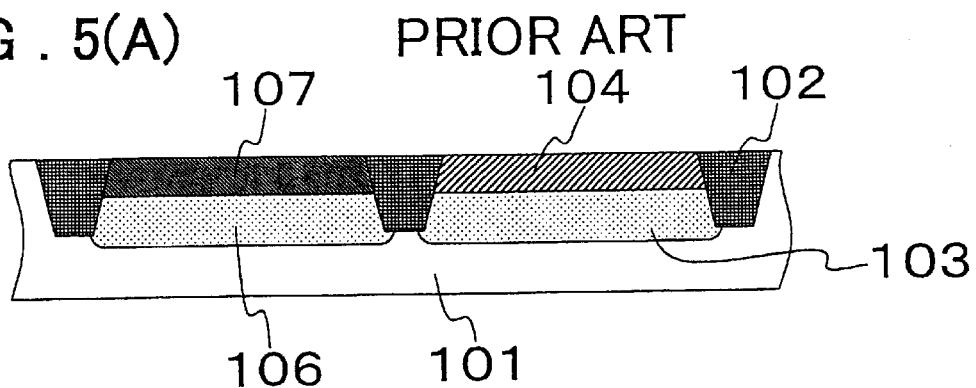
FIGS. 5(A) to (E): fragmentary sectional view showing schematically the steps of one conventional process for preparing a semiconductor device

Conventionally, the P-well region 103 and the N-channel region 104 of a NMOSFET for I/O use as well as the P-well region 106 and the indium N-channel region 107 of a NMOSFET for core use were formed applying photoresist two times (cf. FIG. 5(A)).

Figure 5B:
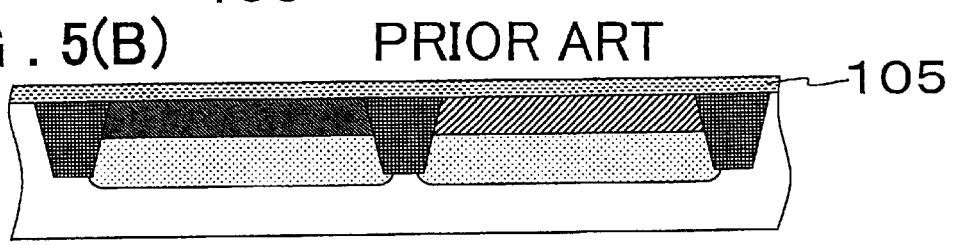

Next, a thick gate insulation film of 26 Å in thickness designed to be used for I/O is formed on the whole surface of a silicon substrate by thermal oxidation (cf. FIG. 5(B)). During this period of time, indium contained in the indium N-channel region is absorbed into the gate insulation film, thereby the concentration of indium becomes decreased to deteriorate the indium effects in the indium N-channel region.

Figure 5C:
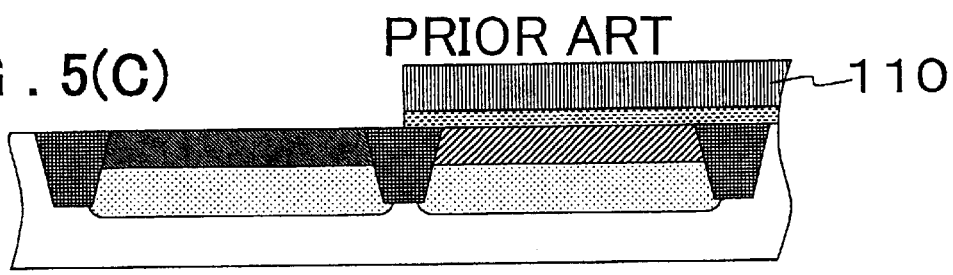

Next, a resist pattern (resist mask 110) is formed applying photoresist before removing the gate insulation film in the region of the NMOSFET for core use by wet etching (cf. FIG. 5(C)).

Figure 5D:
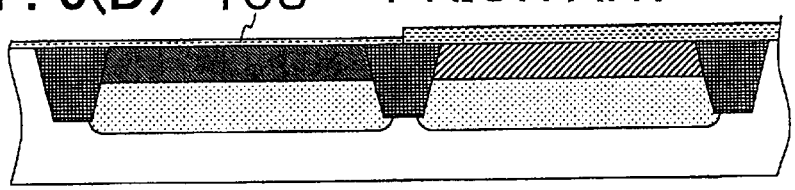

After exfoliating the resist mask 110, a thin gate insulation film 108 of 16 Å is formed over the surface by RTP (FIG. 5(D)). Thereby, a thin gate insulation film of 16 Å is formed in the NMOSFET region for core use, and a thick gate insulation film 105 is formed in the NMOSFET region for I/O use.

Figure 5E:
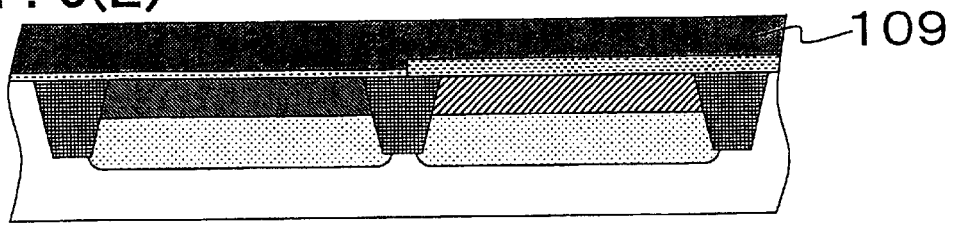

Next, a polysilicon layer 109 designed to be used for a gate electrode is deposited by CVD (cf. FIG. 5(E)), and subsequent procedures after that are the same with those found in the examples of the present invention.

As is evident from the above, the conventional method causes the absorption of indium existing in the indium N-channel region 107 into the gate insulation film 105 on the occasion of forming a gate insulation film 105 shown in FIG. 5(B) by thermal oxidation using a furnace or the like. As a result, the channel concentration of indium in the indium N-channel region is decreased and indium effects are deteriorated thereby.

On the other hand, in Example 1 of the present invention, indium is implanted after forming the gate insulation film 5 (FIG. 1(D) to FIG. 2(E)) so that indium is never absorbed into the gate insulation film because there is no indium existing also during the period of forming a gate insulation film in an oxidation furnace. This holds true for Example 2.

The meritorious effects of the present invention are summarized as follows.

According to the present invention, in forming a N-channel region in a MOSFET having a gate insulation film with different levels of thickness formed thereon using indium correspondingly to respective MOSFET's such as MOSFET for core use and MOSFET for I/O use, indium is not absorbed into the gate insulation film for I/O use by ion-implanting indium into a NMOSFET region for core use after forming a gate insulation film for I/O use, and the deterioration of effects taken by the use of indium can be prevented.

In brief, there is no absorption of indium into the gate insulation film resulting from thermal oxidation process because of ion-implanting indium after forming a gate insulation film. Accordingly, the deterioration of indium effects can be inhibited.

In addition, use of the gate insulation film as a through insulation film makes it possible to protect the surface of a device from metallic pollution.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items might fall under the modifications aforementioned.

What is claimed is:

1. A process for preparing a semiconductor device having a gate insulation film with plural different levels of thickness formed thereon and a N-channel region formed on the predetermined MOSFET region thereof using indium, the process comprising:

(1) 1st step of forming a 1st resist mask on a predetermined region lying on a P-type silicon substrate having an element isolation region formed thereon to form a P-well region and thereafter forming a 1st N-channel region made of components other than indium on said P-well region;

(2) 2nd step of removing said 1st resist mask and thereafter forming a 1st gate insulation film on the surface of said substrate;

(3) 3rd step of forming a 2nd resist mask on said predetermined region except said 1st N-channel region after forming said 1st gate insulation film, and removing partially said 1st gate insulation film;

(4) 4th step of forming a P-well region inside the 1st gate insulation film partially removed region and thereafter forming a 2nd N-channel region containing indium on this P-well region; and (5) 5th step of removing said 2nd resist mask and thereafter forming a 2nd gate insulation film on the surface of said 2nd N-channel region.

2. The process as defined in claim 1, wherein the thickness of said 2nd gate insulation film is thinner than that of said 1st gate insulation film.

3. The process as defined in claim 1, wherein said 2nd gate insulation film is formed by Rapid Thermal Process RTP.

4. The process as defined in claim 2, wherein said 2nd gate insulation film is formed by Rapid Thermal Process RTP.

5. A process for preparing a semiconductor device having a gate insulation film with plural different levels of thickness formed thereon and a N-channel region formed on the predetermined MOSFET region thereof using indium, the process comprising:

(1) 1st step of forming a 1st resist mask on a predetermined region lying on a P-type silicon substrate having an element isolation region formed thereon to form a P-well region and thereafter forming a 1st N-channel region made of components other than indium on said P-well region;

(2) 2nd step of removing said 1st resist mask and thereafter forming a 1st gate insulation film on the surface of said substrate;

(3) 3rd step of forming a 2nd resist mask on said predetermined region except said 1st N-channel region after forming said gate insulation film, thereafter, forming a P-well region in said predetermined region except said 1st N-channel region through said gate insulation film, and thereafter forming a 2nd N-channel region containing indium on this P-well region; and (4) 4th step of removing thinly the surface of said gate insulation film formed on said 2nd N-channel region.

6. The process as defined in claim 1, wherein the thickness of said gate insulation film on said 2nd N-channel region is not more than 20 Å.

7. The process as defined in claim 5, wherein the thickness of said gate insulation film on said 2nd N-channel region is not more than 20 Å.

* * * * *